United States Patent [19]
Matsufusa et al.

[11] Patent Number: 6,093,477
[45] Date of Patent: Jul. 25, 2000

[54] LAMINATED SUBSTRATES AND DATA INPUT UNIT USING THE SAME

[75] Inventors: Hideto Matsufusa; Ryuichi Hagiya, both of Fukushima-ken, Japan

[73] Assignee: Alps Electric Co., Ltd., Tokyo, Japan

[21] Appl. No.: 09/143,550

[22] Filed: Aug. 31, 1998

[30] Foreign Application Priority Data

Sep. 2, 1997 [JP] Japan .................................. 9-237170

[51] Int. Cl.[7] .............................. B32B 3/10; G09G 5/00; G08C 21/00
[52] U.S. Cl. .......................... 428/209; 428/131; 428/137; 428/901; 345/173; 178/18.03
[58] Field of Search .................................. 428/209, 131, 428/137, 901; 345/173; 178/18.03

[56] References Cited

U.S. PATENT DOCUMENTS

| | | | |
|---|---|---|---|
| 5,444,190 | 8/1995 | Yamanami et al. | |
| 5,869,790 | 2/1999 | Shigetaka et al. | 178/18.03 |
| 5,892,191 | 4/1999 | Hagiya et al. | 200/5 A |
| 5,896,127 | 4/1999 | Matsufusa et al. | 345/173 |
| 5,926,171 | 7/1999 | Matsufusa et al. | 345/173 |

*Primary Examiner*—Timothy M. Speer
*Assistant Examiner*—Bryant Young
*Attorney, Agent, or Firm*—Brinks Hofer Gilson & Lione

[57] ABSTRACT

A resist film and a bonding layer are disposed between a sensor substrate and a PCB, and a cutout is formed in the resist film and the bonding layer at the part where the through hole of the sensor substrate communicates with the through hole of a PCB to form an air vent communicating with the outside of the edge part of the laminated substrates. When the conductive material is filled in the through hole from the obverse surface of the sensor substrate, the air in the through hole is released from the air vent to thereby reliably fill the conductive material in the through hole, which can reliably bring the electrode and the land 28 into conduction.

7 Claims, 4 Drawing Sheets

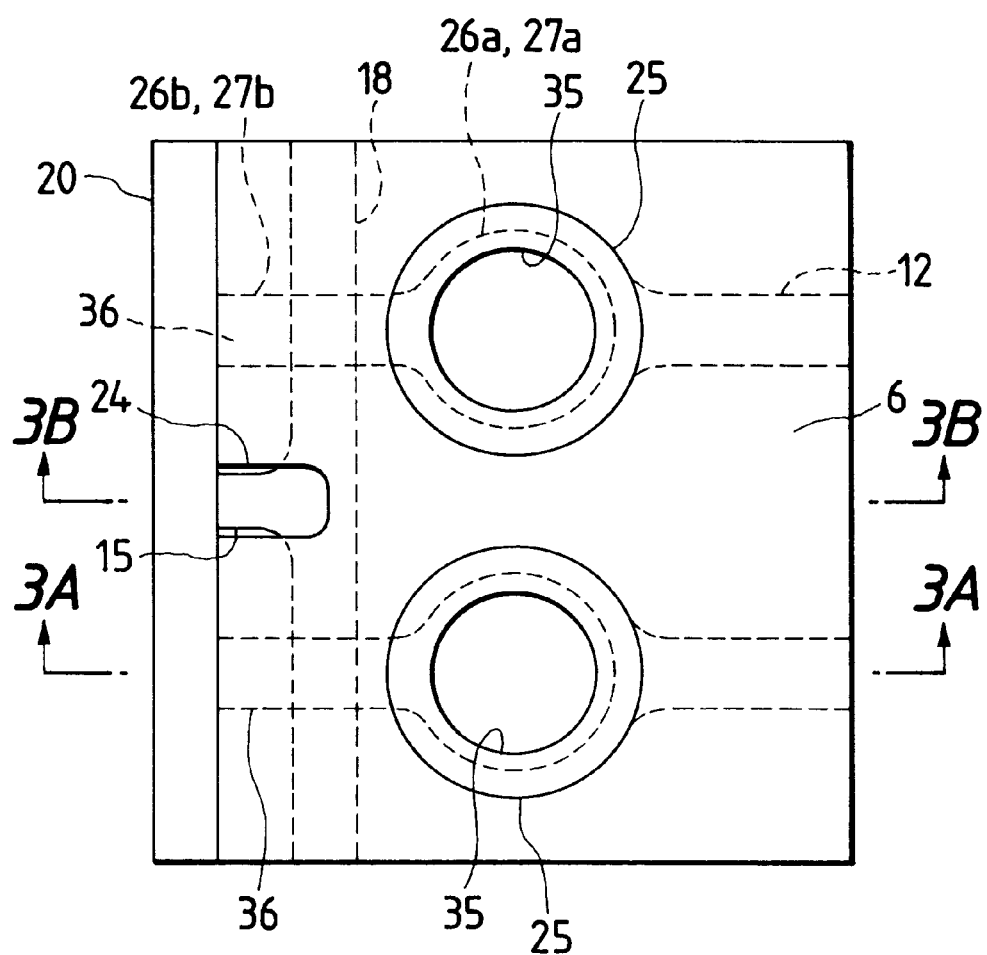

LAMINATED SUBSTRATES AND DATA INPUT UNIT USING THE SAME

BACKGROUND OF THE INVENTION

1. Field of the Invention

The present invention relates to laminated substrates which are used for various kinds of electronic products, wherein each electrode of one substrate is brought into conduction to the wiring pattern of the other substrate via a through hole formed in the substrates, and further relates to a pad-type data input unit which uses the laminated substrates and is used for a computer or the like.

2. Description of the Related Art

In recent years, many computers called a note-type computer have been used in an office or in a home for the purpose of saving a space and many pad-type data input units operated by lightly tracing with a finger have been adopted and put into commercially practical use as an input unit when a cursor or the like displayed on the screen of the computer is moved.

FIG. 5 shows a cross sectional view of a structure of a conventional pad-type data input unit 40.

The above-mentioned type data input unit 40 is constituted by a sensor sheet 10 for detecting coordinates, a printed circuit board (PCB) 21 on which a wiring pattern is printed, and a face sheet 30 to which a finger or the like is directly touched.

The above-mentioned sensor sheet 10 has a sensor substrate 2 for detecting the coordinates to which the finger is touched and the above-mentioned sensor substrate 2 is formed of material such as polyethylene telephthalate (PET) or the like and has X electrodes 12 and Y electrodes 13 formed on both surfaces thereof. Further, resist films 6 and 7 are formed on both surfaces of the above-mentioned sensor substrate 2, respectively, and the underside resist film 7 is bonded and fixed to the above-mentioned PCB 21 by a bonding layer 8.

A plurality of through holes 23 are formed along the periphery of the PCB 21, and a land 29 for bonding the X electrode 12 formed on the above-mentioned sensor substrate 12 to the wiring pattern of the PCB 21 via the above-mentioned through hole 23 is formed.

Further, through holes 35 are formed also in the sensor sheet 10 such that each of them communicates with each through hole 23 of the above-mentioned PCB 21 and the X electrode of the above-mentioned sensor substrate 2 side is brought into conduction to the land 29 of the above-mentioned PCB 21 side by filling a conductive material 11 such as conductive resin or the like in the through holes 35 and 23 from the sensor substrate 2 side.

Furthermore, the above-mentioned face sheet 30 is fixedly bonded to the obverse surface of the above-mentioned sensor sheet 10 side by an adhesive or the like and parts such as an IC or the like necessary for performing data input processing are mounted on the surface (underside surface in the drawing) on which the wiring pattern of the above-mentioned PCB 21 is formed.

In the data input unit 40 constituted as described above, when an operator lightly slides a finger on the face sheet 30, part of a line of electric force heading for the Y electrode 13 from the X electrode 12 in the X electrode 12 and the Y electrode 13 formed on the above-mentioned sensor substrate 2 is absorbed by the finger of the operator to produce a phenomenon that the line of electric force absorbed by the Y electrode 13 is reduced to change electrostatic capacity, whereby a coordinate position touched by the finger can be detected based on the current output value of the sensor substrate 2 which is changed according to a change in the electrostatic capacity.

In the conventional data input unit 40 shown in FIG. 5, the above-mentioned PCB 21 is a double-sided substrate having the wiring patterns on both surfaces thereof and the lands 28 formed on both surfaces of the substrate are connected and brought into conduction through the through hole 23 and the lands 29 formed on both surfaces of the substrate are also connected and brought into conduction through the through hole 23. Therefore, when the X electrode 12 of the above-mentioned substrate 2 is bonded to the land 28 of the above-mentioned PCB 21, the above-mentioned conductive material 11 is not required to be extended to the land 28 of the underside surface, and the PCB 21 and the sensor substrate 21 can be brought into conduction by joining the conductive material 11 to the land 29 of the obverse surface of the PCB 21.

However, the above-mentioned conventional data input unit 40 has the following problems.

1) The PCB 21 has wiring patterns printed on both surfaces thereof and hence is required to form a conductive material made of metal or the like on the inner wall surface of the through hole 23 so as to join the wiring patterns printed on both surfaces of the substrate, which increases costs for manufacturing the PCB 21.

Therefore, if a PCB having a wiring pattern formed only on one side of the substrate is used, the above-mentioned problem can be solved.

2) However, if a PCB having a wiring pattern formed only on one side of the substrate, that is, on the side on which parts are mounted (underside surface side in the drawing), is used instead of the above-mentioned double-sided PCB 21, it is necessary to extend the conductive material 11 supplied from the sensor substrate 2 side to the land 28 of the surface on which the parts of the PCB 21 are mounted.

However, if the conductive material 11 is filled in the through hole 35 from the sensor substrate 2 side, the air in the through hole 35 can not be released outside but remains inside and forms a space as shown by a numeral 31 in FIG. 5 and hence the air and the solvent gas contained in the conductive material 11 build up the resistance to produce the following problems: that is, the conductive material 11 is not extended to the land of the underside surface shown in the drawing of the PCB 21, or, after the conductive material 11 is dried and cured, the above-mentioned space 31 is thermally expanded to bulge and break the conductive material 11 in the through hole, and further, it is impossible to visually check the conductive material 11 from the outside to see that the conductive material 11 completely continues in the through hole.

Further, in order to completely pass the conductive material 11 supplied to the through hole 35 from the sensor substrate 2 side into the through hole 23, there is an other method by which the conductive material 11 is supplied to the through hole 35 from the sensor substrate 2 side and is sucked from the underside surface side of the PCB 21. However, this method needs a sucking unit and increases the cost of the unit.

3) In this kind of data input unit, a face ground for releasing static electricity generated when a face sheet 30 is touched by a finger is required. As shown in FIG. 5, when the PCB 21 having wiring patterns on both surfaces thereof is used, the face ground 32 exposed at the edge part of the substrate can be formed by using the wiring pattern on the surface of the PCB 21. However, when the PCB 21 having a wiring pattern only on the underside surface is used, the face ground can not be formed on the surface of the PCB 21. The face ground formed on the reverse surface of the PCB can not sufficiently release static electricity charged on the face sheet 30.

SUMMARY OF THE INVENTION

It is an object of the present invention to solve the above-mentioned problems of the related art or to provide laminated substrates brought into conduction via through holes by reliably filling a conductive material in the through holes.

It is another object of the present invention to reliably bring both substrates into conduction even in the laminated substrates, one of which has a wiring pattern only on the surface opposite to the surface opposed to the other substrate.

It is still another object of the present invention to provide a data input unit using laminated substrates which reliably have conduction between the substrates and easily form the face grounds.

Laminated substrates according to the present invention comprises a first substrate having electrodes and through holes, a second substrate having a wiring pattern, and an insulating layer, wherein the first substrate and the second substrate are laminated with the insulating layer between them, wherein a conductive material is filled in the through holes of the above-mentioned first substrate to thereby bring the above-mentioned electrodes of the first substrate and the wiring pattern of the second substrate into conduction via the above-mentioned conductive material, and wherein the above-mentioned insulating layer and at least one of the above mentioned substrates have air releasing passages for making the above-mentioned through holes communicate with a space outside the edge of the substrate.

In the above-mentioned means in which the through holes are formed at least in the first substrate, when the conductive material such as conductive resin or the like is filled in the through holes, the air in the through holes and the solvent gas contained in the conductive material are released to the side of the substrate through the air releasing passages between the substrates and hence do not build up the resistance, whereby the conductive material is reliably filled in the through holes to thereby bring the electrodes of the first substrate and the wiring pattern of the second substrate into conduction. Therefore, they are brought into conduction only by applying the conductive resin or the like by a squeegee by a conventional screen printing method.

In the above-mentioned means, the through holes, each of which communicates with the through holes of the above-mentioned first substrate and the above-mentioned air releasing passages, are formed in the second substrate and the above-mentioned conductive material filled in the through holes may be brought into conduction to the above-mentioned wiring pattern formed on the reverse surface of the second substrate facing the side opposite to the first substrate.

Since the air and the solvent gas are reliably released from the above-mentioned air releasing passages, for example, even if the wiring pattern and the lands are formed only on the reverse surface of the second substrate facing the side opposite to the first substrate, the conductive material filled in the through holes is extended to the reverse surface side of the second substrate and is joined to the lands of the reverse surface. Therefore, the substrate having the wiring pattern only on one side thereof can be used as the second substrate.

The insulating layer in which the air releasing passages are formed is a bonding layer for bonding the first substrate to the second substrate, or the insulating layer in which the air releasing passages are formed is a resist layer for covering the surface of the first substrate or the second substrate.

Further, the above-mentioned insulating layer comprises an insulating sheet and a bonding layer and the air releasing passages can be formed in at least one of them.

Furthermore, according to the present invention, the air releasing passages can be formed by forming cutouts in at least one of the substrates in the opposite surfaces of the substrates, or the air releasing passages may be formed by cutting the dummy electrodes formed on the opposite surface of the substrate.

The laminated substrates according to the present invention can be used various kinds of electronic parts. However, a data input unit using the laminated substrates according to the present invention will be described below.

That is, the data input unit using the laminated substrates according to the present invention is characterized in that it has one of the above-mentioned laminated substrates and that the X electrodes and the Y electrodes which are insulated from each other are formed on the above-mentioned first substrate to detect a change in electrostatic capacity between the X electrodes and the Y electrodes.

In the above-mentioned unit, a face sheet is laminated on the surface of the first substrate via an insulating body and a ground pattern formed on the edge of the above-mentioned first substrate may be oozed from the above-mentioned insulating body at the positions where it does not overlap the above-mentioned air releasing passages.

In the above-mentioned means, the ground pattern is formed on the first substrate and is the face ground. Therefore, even if the second substrate is the single-sided substrate having the wiring pattern only on the one side surface thereof, the face ground can be formed near the face sheet.

According to the present invention, since the air releasing passage communicating with the side of the substrate is formed as described above, there are worries that the conductive material oozing from the air releasing passage could be extended to and be put into contact with the above-mentioned face ground from the edge of the substrate to make a short circuit between the electrode of one substrate and the wiring pattern of the other substrate via the conductive material and that, if the conductive material is made near the face ground and a silver base conductive material is used, migration could be generated. Therefore, the face ground is made in the region where it does not overlap the air releasing passage in the plan, which does not make the above-mentioned short circuit.

BRIEF DESCRIPTION OF THE DRAWINGS

FIG. 2 is a plan view of a Z area in FIG. 1.

DESCRIPTION OF THE PREFERRED EMBODIMENTS

A data input unit according to the present invention will be described below with reference to the accompanying drawings.

Figure 1:
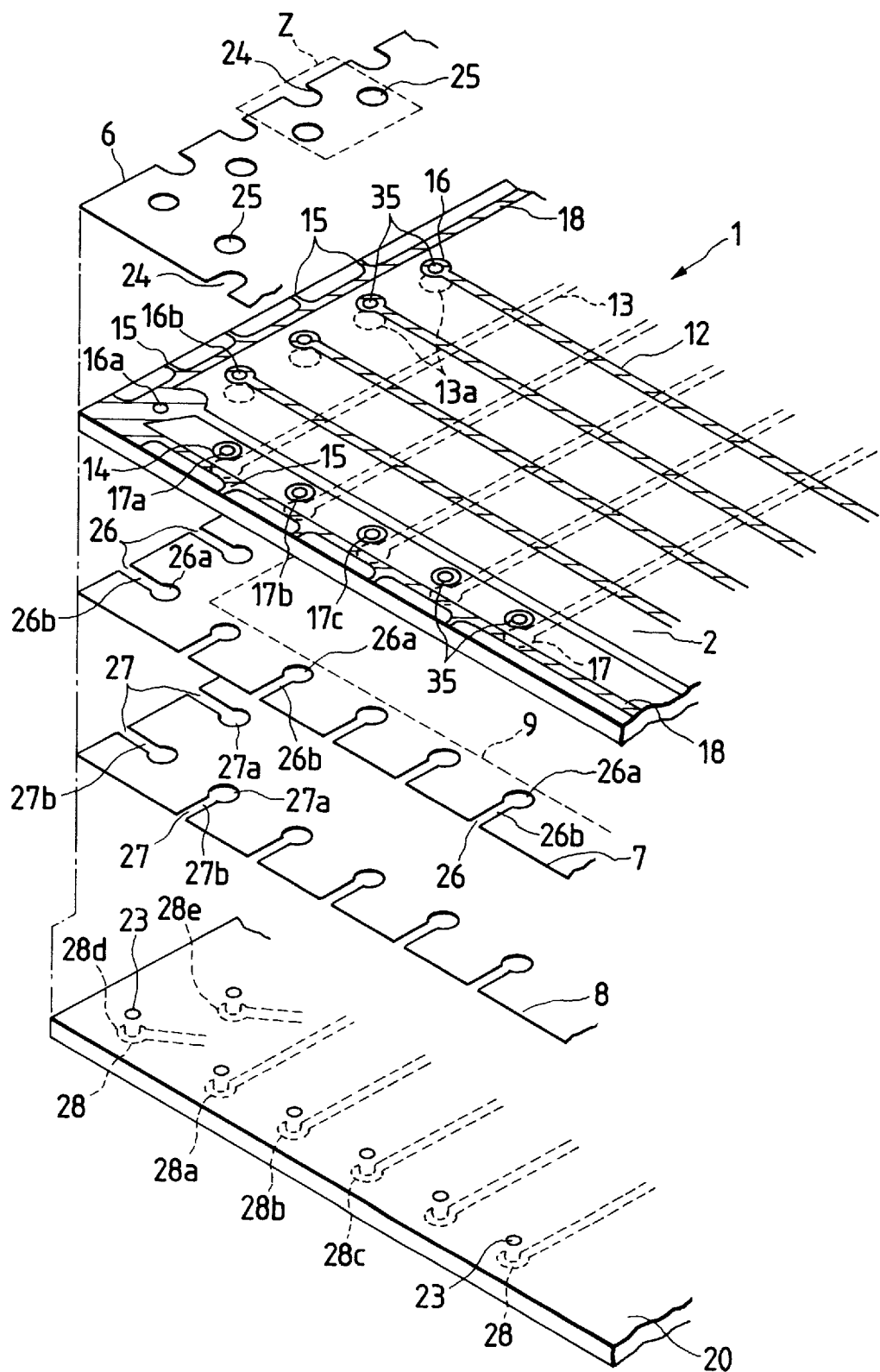
FIG. 1 is a perspective view showing laminated substrates used for a data input unit according to the present invention.

FIG. 1 is a perspective view showing laminated substrates used for a data input unit according to the present invention.

FIG. 2 is a plan view of a Z area in FIG. 1.

Figure 3A:
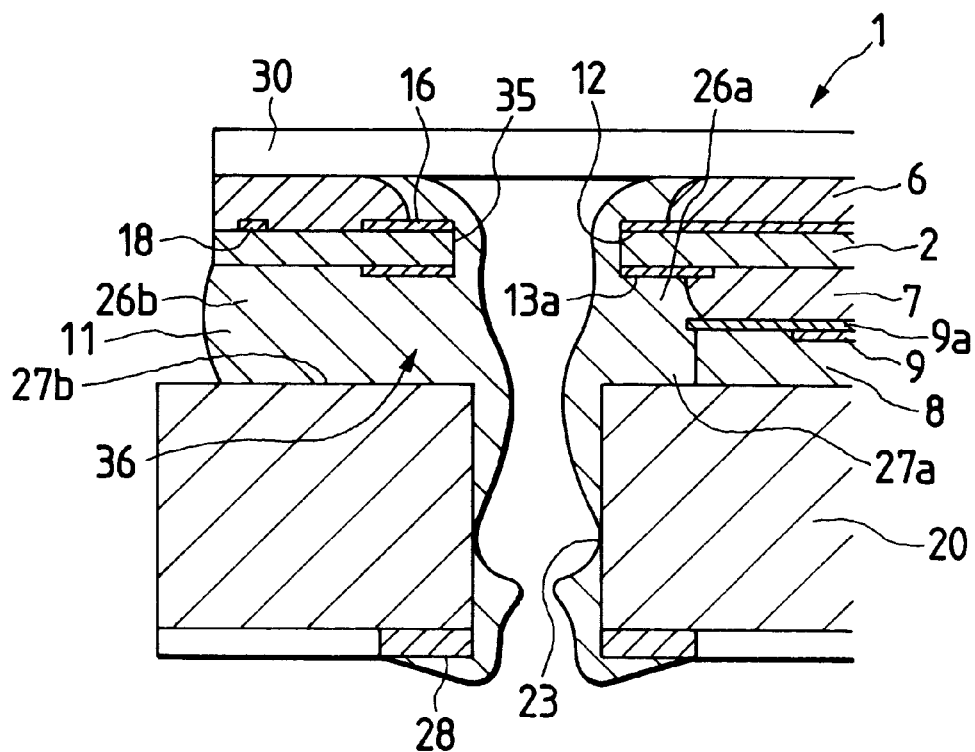
FIG. 3A is a cross sectional view of a part cut at a line 3A—3A in FIG. 2

FIG. 3A is a cross sectional view of a part cut at a line 3A—3A in FIG. 2 and

Figure 3B:
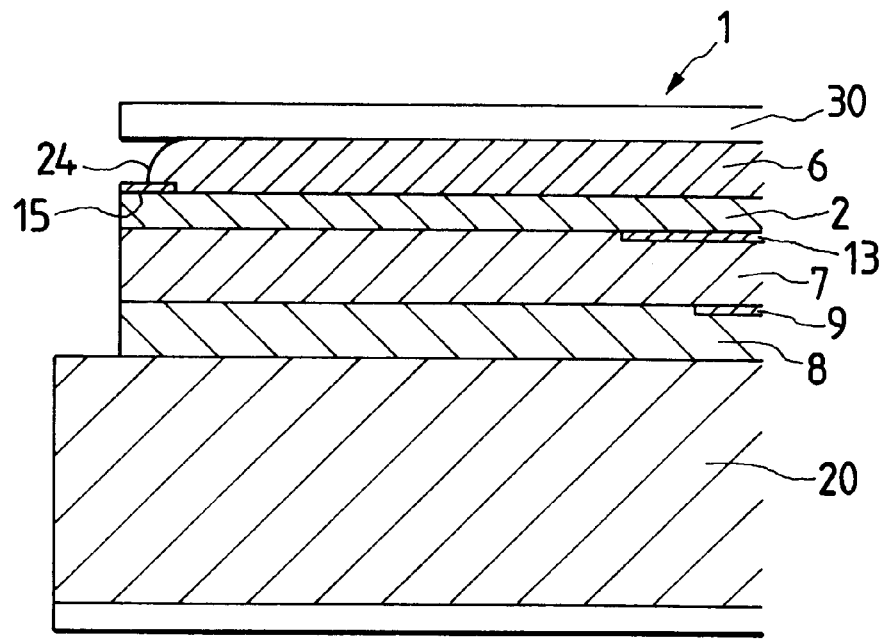
FIG. 3B is a cross sectional view of a part cut at a line 3B—3B in FIG. 2

FIG. 3B is a cross sectional view of a part cut at a line 3B—3B in FIG. 2.

In the above-mentioned data input unit 1, both surfaces of a sensor substrate 2 as a first substrate on which electrode patterns are formed are covered by resist films 6 and 7, and a printed circuit board 20 (hereinafter referred to as PCB as a second substrate having a wiring pattern on one surface thereof is fixedly bonded to the underside surface of the sensor substrate 2 via a bonding layer 8.

The above-mentioned sensor substrate 2 comprises a resin sheet such as polyethylene telephthalate (PET) or the like. A plurality of X electrodes 12 are formed in parallel on the obverse surface of the sensor substrate 2 and a plurality of Y electrodes 13 are formed in parallel on the reverse surface of the sensor substrate 2, and the X electrodes 12 and the Y electrodes 13 are arranged in a matrix and intersect each other, and an input point is formed at each intersection. In this data input unit 1, coordinate information is input by a change in electrostatic capacity between the X electrode 12 and the Y electrode 13 at the input point.

Dummy electrodes 14, each of which is opposed to the end part 17 of each above-mentioned Y electrode 13, are formed on the edge part of the obverse surface of the sensor substrate 2 on which the X electrodes 12 are formed, and dummy electrodes 13a, each of which is opposed to the end part 16 of each X electrode 12, are formed on the reverse surface of the sensor substrate 2. Through holes 35, each of which pierces the sensor substrate 2 in a region where the end part 17 of the above-mentioned Y electrode 13 is opposed to the dummy electrode 14, are formed, and through holes 35, each of which pierces the sensor substrate 2 in a region where the end part 16 of the above-mentioned X electrode 12 is opposed to the dummy electrode 13a, are formed.

A ground pattern 18 is formed slightly inside the edge part of the obverse surface of the above-mentioned sensor substrate 2 and face grounds 15 extending to the edge of the sensor substrate 2 are integrally formed with the ground pattern 18. Each face ground 15 extends to the edge of the sensor substrate 2 in the middle position of the X electrodes 12 and 12 and in the middle position of the Y electrodes 13 and 13. The face ground 15 is used for releasing static electricity to the earth.

In this respect, in order to improve a resolution, the width of a line of the above-mentioned Y electrode 13 is larger than the width of a line of the X electrode 12. Further, it is preferable that the thickness of the above-mentioned sensor substrate (resin sheet) 2 ranges nearly from 250 to 800 μm.

On both surfaces of the above-mentioned sensor substrate 2, resist films 6 and 7 made of, for example, polyimide resin are laminated. On the above-mentioned resist film 6 of the obverse surface side, a cutout 24 is formed at each position opposed to each above-mentioned face ground 15 and a cutout (hole) 25 is made at each position opposed to the end part 16 of each above-mentioned X electrode 12 and at each position opposed to the end part 17 of each Y electrode 13. On the above-mentioned resist film 7 of the reverse surface side, a cutout 26 shaped like a lock is formed at each position opposed to each dummy electrode 13a of the sensor substrate 2 and at each position opposed to the end part 17 of each Y electrode 13. Each cutout 26 exposes the dummy electrode 13a and the end part 17 of the Y electrode 13 and is formed by a circular part 26a opposed to the through hole 35 of the sensor substrate 2 and by an air releasing passage 26b communicating with the end part of the substrate 2 from the circular part 26a. The above-mentioned resist films 6 and 7 are formed on the obverse and reverse surfaces of the sensor substrate 2 by a printing method such that they are formed in a shape shown in FIG. 1.

A ground layer 9 made of Cu foil or Ag base paste and having low resistance is formed on the underside surface of the above-mentioned resist film 7. The ground layer 9, as shown in FIG. 3A, is formed on an insulating sheet 9a made of PET or the like by bonding or printing. In this case, the above-mentioned ground layer 9 is formed in a region inside the cutouts 26 of the above-mentioned resist film 7.

Further, a bonding layer 8 for bonding the above-mentioned resist film 7 and the ground layer 9 to the PCB 20 is formed on the underside surface of the above-mentioned ground layer 9. A cutout 27 similar to the cutout 26 of the above-mentioned resist film 7 is formed at the same position as the cutout 26 on the above-mentioned bonding layer 8. The cutout 27 is also formed by a circular part 27a and by an air releasing passage 27b joined to the circular part 27a. In this respect, the material of the above-mentioned bonding layer 8 is a hot-melt adhesive or the like and the bonding layer 8 is formed on the obverse surface of the PCB 20 by a printing method such that it is formed in a shape shown in FIG. 1, or the bonding layer 8 is formed on the surface (underside surface) of the above-mentioned ground layer 8 of the sensor substrate 2 side by a printing method.

The PCB 20 to be the second substrate is a single-sided substrate having a wiring pattern only on the underside surface reverse surface) thereof and has lands 28, each of which is formed on the above-mentioned underside surface at the part opposed to each dummy electrode 13a and the end part 17 of each Y electrode 13 which are formed on the above-mentioned sensor substrate 2, and through holes 23, each of which is made at each land 28.

That is, the patterns 17a, 17b, 17c, . . . of the above-mentioned sensor substrate 2 are opposed to the lands 28a, 28b, 28c, . . . of the above-mentioned PCB 20 side via the through holes 35 and 23, respectively, and the patterns 16a, 16b, . . . of the above-mentioned sensor substrate 2 are opposed to the lands 28d, 28e, . . . of the above-mentioned PCB 20 side via the through holes 35 and 23, respectively.

As shown in FIG. 3A and FIG. 3B, a conductive material 11 is filled in the laminated substrates made by laminating the sensor substrate 2 and the PCB 20 and by bonding and fixing them via the bonding layer 8 from the through hole 35 of the sensor substrate 2. Conductive resin made by mixing for example epoxy-base thermosetting resin with a conductive filler such as Ag or the like can be used as the conductive material 11. The conductive material is filled by a squeegee in the position where the through hole 35 is formed on the obverse surface of the sensor substrate 2 by a screen printing method.

The end part 16 of the X electrode 12 of the sensor substrate 2 and the land 28 formed on the reverse surface of the PCB 20 are brought into conduction by the conductive material 11, and in the same way, the end part 17 of the Y electrode 13 of the sensor substrate 2 and the land 28 formed on the reverse surface of the PCB 20 are brought into conduction by the conductive material 11.

A wiring pattern extending from the above-mentioned lands 28 is formed on the reverse surface of the PCB 20 and electronic parts such as IC or the like are mounted on the reverse surface of the PCB 20 such that they are brought into conduction to the wiring pattern. Further, a face sheet 30 which is operated by the direct touch of a finger is fixedly bonded by an adhesive or the like to the obverse surface of the above-mentioned resist film 6 to be the conductive body of the obverse surface of the sensor substrate 2.

FIG. 2 is a partially enlarged plan view showing an area Z in FIG. 1, and FIG. 3A and FIG. 3B are cross sectional views in FIG. 2.

As shown in FIG. 2 and FIG. 3A, the conductive material 11 is filled in the through hole 35 of the sensor substrate 2 and the through hole 23 of the PCB 20, and the above-mentioned air releasing passages 26b and 27b formed in the resist film 7 to be an insulating layer and in the bonding layer 8 are overlapped at the same position between the sensor substrate 2 and the PCB 20 to form an air vent 36 which makes a space in the through holes 35 and 23 communicate with the space outside the edge part of the laminated substrates.

Therefore, when the conductive material 11 is filled in the through hole 35 and the through hole 23, the air in the through holes 35 and 23, the air in the circular part 26a of the resist film 7 at the same position as the above-mentioned through holes, the air in the circular part 27a in the bonding layer 8 and solvent gas contained in the conductive material 11 are released from the above-mentioned air vent 36 to the side of the substrates. With the result, when the conductive material 11 is filled in, the air does not produce resistance and hence the conductive material 11 spreads sufficiently in the through holes 35 and 23 and goes down to the lower end of the through hole 23 without forming a film by surface tension. Further, the inside air is not expanded in a drying process. Therefore, the conductive material 11 is reliably put into contact with the land 28 formed on the underside surface of the PCB 20 to reliably bring the X electrode 12 or the Y electrode 13 into conduction to the land 28.

In this respect, the air vent 36 is not limited to the air releasing passages 26b and 27b of the resist film 7 and the bonding layer 8 and may be only one of the air releasing passages 26b or 27b and may be a groove made in the PCB 20.

Figure 4:
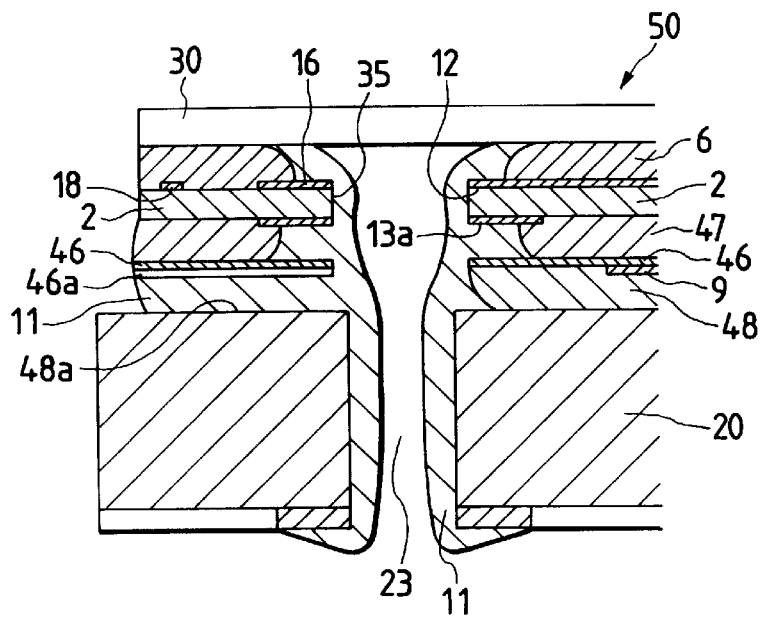
FIG. 4 is a partial cross sectional view of the other preferred embodiment of the laminated substrates according to the present invention.
Figure 5:
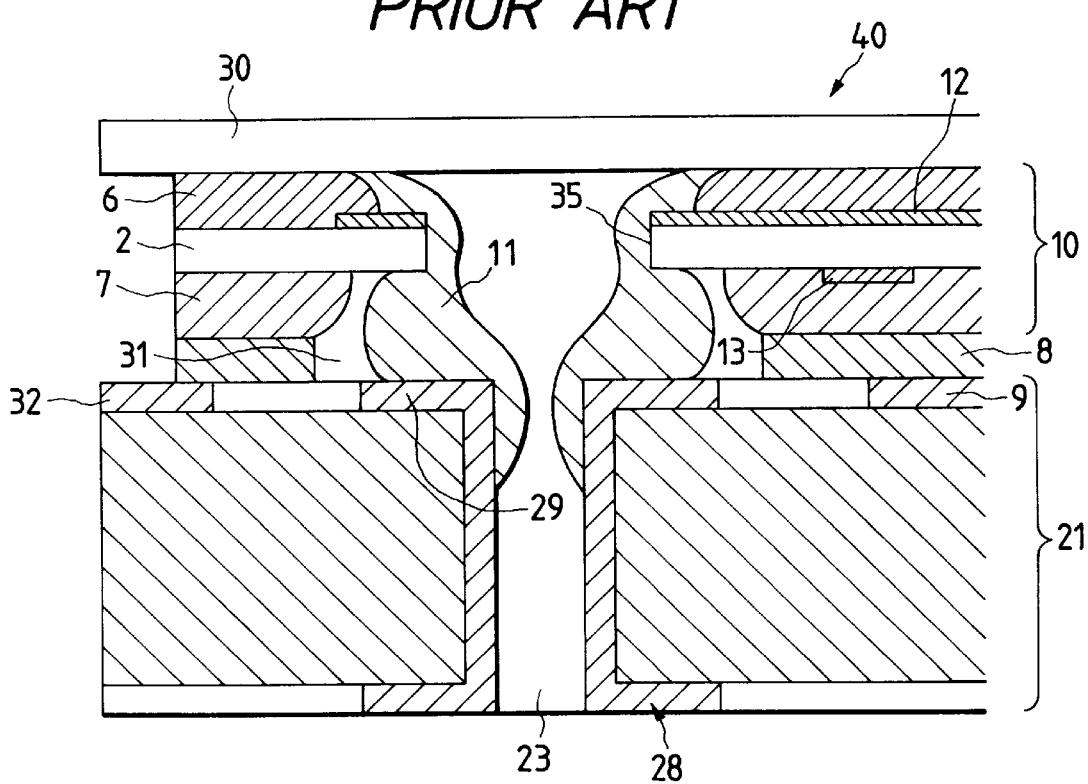
FIG. 5 is a cross sectional view showing a lamination structure of a conventional data input unit.

FIG. 4 is a cross sectional view showing the other preferred embodiment according to the present invention.

A data input unit 50 shown in FIG. 4 has a lamination structure comprising a sensor substrate 2, an insulating sheet 46 and a PCB 20, wherein the insulating sheet 46 is bonded to the sensor substrate 2 by an adhesive 47 and is bonded to the PCB 20 by an adhesive 48. The insulating sheet 46 is extended to the end of a laminated substrate body and air releasing passages 48a and 46a leading to the side of the substrate are formed in the adhesive 48 and the insulating sheet 46. In this respect, the air releasing passages 48a and 46a are shaped and arranged in the same way as the above-mentioned air releasing passages 26b and 27b. The above-mentioned constitution eliminates the forming process of the above-mentioned resist layer 7 to deliver a reduction in process. Further, the air releasing passage may be at least one of the air releasing passages 48a and 46a or may be a groove made in the PCB 20.

Further, as shown in FIG. 2 and FIG. 3B, a face ground 15 is exposed from the cutout 24 formed in the resist film 6 to be an insulating body of the obverse surface of the sensor substrate 2. Since the face ground 15 is formed on the obverse surface of the sensor substrate 2 and is near under the face sheet 30, static electricity charged on the face sheet 30 is easily discharged to the face ground 15.

Furthermore, as shown in FIG. 2, the part where the face ground 15 is exposed is an area where it does not overlap the air vent 36. Therefore, even if the conductive material 11 spread from the air vent 36 to the side of the laminated substrates flows out to the edge part of the sensor substrate 2, the conductive material 11 is not put into contact with the face ground 15 and hence does not make a short circuit between the conductive material 11 and the face ground 15. Besides, even if the conductive material 11 is a silver-base conductive material, the generation of migration caused by the approach of the conductive material 11 to the face ground 15 can be prevented.

In this regard, the above-mentioned air vent is formed in the same way also in a through hole for joining the Y electrode 13 to the land 28 of the PCB 20. Further, the face ground 15 positioned in the middle of the Y electrodes 13 and 13 does not overlap the air vent as in the case of FIG. 2.

As described above, in the laminated substrates according to the present invention and the data input unit using the same, the air releasing passages leading to the outside from the through hole are formed in the insulating layer between the substrates and hence the conductive material is reliably filled in the through hole to make a reliable conduction between the substrates. Further, a single-sided substrate having a wiring pattern only on the reverse surface side thereof can be used as the second substrate, which can reduce the costs of the parts. Besides, if the air releasing passages are formed in the insulating layer, the air releasing passages can be easily formed when the pattern of the insulating layer is formed.

Further, if the face grounds are formed on the first substrate, static electricity charged on the face sheet can be easily released. Furthermore, even if the second substrate is a single-sided substrate, the face grounds can be formed just under the face sheet. Besides, the conductive material oozing from the air releasing passage does not make a short circuit with the face ground by making the air releasing passage at the position where it does not overlap the face ground.

What is claimed is:

1. Laminated substrates comprising:
 a first substrate having electrodes and through holes;
 a second substrate having a wiring pattern; and
 an insulating layer,
 wherein the first substrate and the second substrate are laminated with the insulating layer sandwiched between them;
 wherein a conductive material is filled in the through holes of the first substrate to bring the electrodes of the first substrate and the wiring pattern of the second substrate into conduction via the conductive material; and
 wherein the insulating layer and at least one of the substrates have air releasing passages for making the through holes communicate with a space outside the edge of the substrate.

2. Laminated substrates according to claim 1, wherein the through holes communicating with the through holes of the first substrate and with the air releasing passages are formed in the second substrate and the conductive material filled in the through holes is brought into conduction to the wiring pattern formed on the reverse surface of the second substrate facing the side opposite to the first substrate.

3. Laminated substrates according to claim 1 or claim 2, wherein the insulating layer in which the air releasing passages are formed is a bonding layer for bonding the first substrate to the second substrate.

4. Laminated substrates according to claim 1 or claim 2, wherein the insulating layer in which the air releasing passages are formed is a resist layer for covering the surface of the first substrate or the second substrate.

5. Laminated substrates according to claim 1 or claim 2, wherein the insulating layer comprises an insulating sheet and a bonding layer and wherein the air releasing passages are formed in at least one of them.

6. A data input unit having the laminated substrates according to claim 1 or claim 2, wherein the X electrodes and the Y electrodes which are insulated from each other are formed on the first substrate to detect a change in electrostatic capacity between the X electrodes and the Y electrodes.

7. A data input unit according to claim 6, wherein a face sheet is laminated on the surface of the first substrate via an insulating body and wherein a ground pattern formed on the edge part of the first substrate is oozed from the insulating body at the positions where it does not overlap the air releasing passages.

* * * * *